(12) United States Patent
Heo et al.

(10) Patent No.: US 9,570,242 B2
(45) Date of Patent: Feb. 14, 2017

(54) FLEXIBLE TI—IN—ZN—O TRANSPARENT ELECTRODE FOR DYE-SENSITIZED SOLAR CELL, AND METAL-INSERTED THREE-LAYER TRANSPARENT ELECTRODE WITH HIGH CONDUCTIVITY USING SAME AND MANUFACTURING METHOD THEREFOR

(75) Inventors: Gi Seok Heo, Gwangju (KR); Tae Won Kim, Gwangju (KR); Jae Cheol Park, Jeollanam-do (KR); Kwang Young Kim, Seoul (KR)

(73) Assignee: KOREA INSTITUTE OF INDUSTRIAL TECHNOLOGY, Chungcheongnam-Do (KR)

(*) Notice: Subject to any disclaimer, the term of this patent is extended or adjusted under 35 U.S.C. 154(b) by 87 days.

(21) Appl. No.: 13/822,700

(22) PCT Filed: May 2, 2012

(86) PCT No.: PCT/KR2012/003425
§ 371 (c)(1),
(2), (4) Date: Mar. 13, 2013

(87) PCT Pub. No.: WO2012/150805
PCT Pub. Date: Nov. 8, 2012

(65) Prior Publication Data
US 2014/0109957 A1   Apr. 24, 2014

(30) Foreign Application Priority Data
May 2, 2011   (KR) .................. 10-2011-0041687

(51) Int. Cl.
*C23C 14/08*   (2006.01)
*H01G 9/20*   (2006.01)
(Continued)

(52) U.S. Cl.
CPC .......... *H01G 9/2036* (2013.01); *C23C 14/022* (2013.01); *C23C 14/042* (2013.01);
(Continued)

(58) Field of Classification Search
CPC ...... C23C 14/022; C23C 14/042; C23C 14/08; C23C 14/205; C23C 28/322; C23C 28/345; H01B 1/08; H01G 9/2031; H01G 9/2036; H01L 51/442; Y02E 10/542; Y02E 10/549
(Continued)

(56) References Cited

U.S. PATENT DOCUMENTS 6,040,056 A   3/2000   Anzaki et al.

FOREIGN PATENT DOCUMENTS

KR   10-2009-0063263 A   6/2009
KR   10-2010-0072723 A   7/2010
(Continued)

OTHER PUBLICATIONS

Park et al. "Thin Ag Layer Inserted GZO Multilayer Grown by Roll-to-Roll Sputtering for Flexible and Transparent Conducting Electrodes", Journal of the Electrochemical Society, 157 (8) J301-J306 (Jun. 2010).*
(Continued)

*Primary Examiner* — Rodney McDonald
(74) *Attorney, Agent, or Firm* — The PL Law Group, PLLC

(57) ABSTRACT

The present invention relates to a flexible transparent electrode for a dye-sensitized solar cell and a manufacturing method for same, and more specifically, to a flexible Ti—In—Zn—O transparent electrode for a dye-sensitized solar cell and a manufacturing method for same, and to a metal-inserted three-layer transparent electrode with high conductivity using the flexible transparent electrode and a manu-
(Continued)

facturing method for same, wherein compared with the conventional fluorine-doped tin oxide (FTO) and indium-tin oxide (ITO) transparent electrodes with a high deposition temperature, the flexible transparent electrode, despite being deposited at room or low temperature, has low surface resistance, high conductivity and transmittance, superior resistance against external bending, improved surface characteristics and better surface roughness performance.

11 Claims, 13 Drawing Sheets

(51) Int. Cl.
*H01L 51/44* (2006.01)
*C23C 14/02* (2006.01)
*C23C 14/04* (2006.01)
*C23C 14/20* (2006.01)
*C23C 28/00* (2006.01)
*H01B 1/08* (2006.01)

(52) U.S. Cl.
CPC ............ *C23C 14/08* (2013.01); *C23C 14/205* (2013.01); *C23C 28/322* (2013.01); *C23C 28/345* (2013.01); *H01B 1/08* (2013.01); *H01G 9/2031* (2013.01); *H01L 51/442* (2013.01); *Y02E 10/542* (2013.01); *Y02E 10/549* (2013.01); *Y02P 70/521* (2015.11)

(58) Field of Classification Search
USPC .......... 204/192.26, 192.27, 192.29; 136/252
See application file for complete search history.

(56) References Cited

FOREIGN PATENT DOCUMENTS

| | | |
|---|---|---|
| KR | 10-2011-0001206 A | 1/2011 |
| KR | 10-2012-0062341 A | 6/2012 |
| WO | 2010-036963 A1 | 4/2010 |

OTHER PUBLICATIONS

Heimke et al. "RF superimposed DC sputtering of zinc tin oxide (ZTO) and indium zinc oxide (IZO)", Advanced Coatings for Large-Area or High-Volume Products. ICCG 2008, 7th International Conference on Coatings on Glass and Plastics. Proceedings : Jun. 15-19, 2008, NH Conference Centre Koningshof, Eindhoven/Veldhoven, the Netherlands Eindhoven, 2008.*
Park et al. "Stacking Sequence Effect on the Electrical and Optical Properties of Multistacked Flexible IzO—Ag—IzO Electrodes", Electrochemical and Solid-State Letters, 13 (5) J39-J42 (Jan. 2010).*
International Search Report for PCT/KR2012/003425.
Office Action from KIPO dated on Aug. 9, 2012 in the counterpart Korean patent application.
Office Action from SIPO dated on Jun. 20, 2014 in the counterpart Chinese patent application.

\* cited by examiner

Sintered Ti coating layer
: Not removed by Scotch tape

FLEXIBLE TI—IN—ZN—O TRANSPARENT ELECTRODE FOR DYE-SENSITIZED SOLAR CELL, AND METAL-INSERTED THREE-LAYER TRANSPARENT ELECTRODE WITH HIGH CONDUCTIVITY USING SAME AND MANUFACTURING METHOD THEREFOR

CROSS REFERENCE TO RELATED APPLICATIONS AND CLAIM OF PRIORITY

This patent application is a National Phase application under 35 U.S.C. §371 of International Application No. PCT/KR2012/003425, filed May 2, 2012, entitled FLEXIBLE TI-IN-ZN-O TRANSPARENT ELECTRODE FOR DYE-SENSITIZED SOLAR CELL, AND METAL-INSERTED THREE-LAYER TRANSPARENT ELECTRODE WITH HIGH CONDUCTIVITY USING SAME AND MANUFACTURING METHOD THEREFOR, which claims priority to Korean Patent Application No. 10-2011-0041687, filed May 2, 2011, entire contents of which are incorporated herein by reference.

BACKGROUND

1. Technical Field

The present invention relates to a flexible transparent electrode for a dye-sensitized solar cell and a method of manufacturing the same, and, more particularly, to a flexible Ti—In—Zn—O transparent electrode for a dye-sensitized solar cell and a method of manufacturing the same, and to a metal-inserted three-layer transparent electrode with high conductivity using the flexible transparent electrode and a method of manufacturing the same, wherein compared with the conventional fluorine-doped tin oxide (FTO) and indium-tin oxide (ITO) transparent electrodes with high deposition temperature, the flexible transparent electrode, despite being deposited at room temperature or low temperature, has low surface resistance, high conductivity and transmittance, superior resistance to external bending, improved surface characteristics and better surface roughness performance.

2. Description of the Related Art

Typically, a dye-sensitized solar cell is a kind of solar cell which causes chemical power generation using the ability of a dye to absorb solar light, and generates power by absorbing wavelengths at about 400~800 nm among solar light having wavelengths from 300 nm to 2,500 nm.

FIG. 1 is a cross-sectional view schematically illustrating a conventional dye-sensitized solar cell, in which a typical dye-sensitized solar cell includes a transparent glass substrate, a photoelectrode (an anode) including a metal oxide and a dye, an electrolyte, and a counter electrode (a cathode).

The photoelectrode which is provided in the form of a porous membrane is made of an n-type transition metal oxide semiconductor having a wide bandgap, such as $TiO_2$, ZnO, or $SnO_2$, and a monolayer of a dye is adsorbed on the surface thereof. When solar light is incident on a solar cell, electrons at a Fermi level in the dye absorb solar energy and are thus excited to an upper level at to which electrons are not occupied. As such, vacancies at a lower level from which the electrons escape are occupied again by supplying electrons from ions in the electrolyte. The ions which supply electrons to the dye are transferred to the counter electrode and thus receive electrons.

The counter electrode which is the cathode acts as a catalyst for a redox reaction of ions in the electrolyte so that electrons are supplied to the ions of the electrolyte via the redox reaction on the surface thereof.

In order to increase energy conversion efficiency of a dye-sensitized solar cell, a Pt thin-film having superior catalytic activity is mainly used, and a precious metal such as Pd, Ag, Au, etc., having characteristics similar to those of Pt, and a carbonaceous material such as carbon black or graphite may be utilized in the electrode.

The transparent glass substrate transports electrons to an external circuit while enabling absorption of solar energy and is typically formed of a transparent conductive oxide (TCO). Because an absorber layer on which solar light is incident to emit electrons and holes has to be covered with an electrode, its functions cannot exhibit or its efficiency may decrease when light is blocked by the electrode. For this reason, the TCO is used.

In particular, the TCO mainly includes FTO (Fluoride-doped Tin Oxide, $Sn(F)O_2$).

However, such an FTO thin-film is deposited using an expensive device such as a large chemical vapor deposition device, undesirably resulting in complicated processes and increased manufacturing costs. Furthermore, the source materials therefor are patented in Japan's leading companies and universities, and all of them are currently imported.

The porous membrane formed on the FTO thin-film via screen printing using $TiO_2$ nanoparticles has many defects at the inside and the surface of the particles because of characteristics of the nanoparticles, and thus scattering of electrons and recombination of electrons-holes may reduce the electron mobility and the electron lifetime, undesirably lowering electronic conductivity and resulting in low efficiency.

In the case of FTO, because surface characteristics between FTO and a Ti:Dye layer formed thereon become poor, solar cell efficiency may decrease, and upon bending a flexible dye-sensitized solar cell, the TCO and the absorber layer may be easily stripped off.

Hence, there is a need for a novel flexible transparent electrode for a dye-sensitized solar cell, which may exhibit high transmittance and low surface resistance to the extent that it may be used in lieu of FTO, may be formed via deposition at room temperature or low temperature on a plastic substrate, and may improve surface characteristics with a Ti:Dye layer.

SUMMARY

Accordingly, the present invention has been made keeping in mind the above problems occurring in the related art, and an object of the present invention is to provide a transparent electrode for a dye-sensitized solar cell, which may be applied to a flexible substrate so as to improve resistance to external bending, and a method of manufacturing the same.

Another object of the present invention is to provide a transparent electrode for a dye-sensitized solar cell, which may have low surface resistance and high conductivity and transmittance despite being deposited at room temperature or low temperature, and a method of manufacturing the same.

Still another object of the present invention is to provide a transparent electrode for a dye-sensitized solar cell, which may be improved in terms of surface characteristics with a Ti:Dye layer and an electrolyte, device stability, and surface roughness, and a method of manufacturing the same.

Yet another object of the present invention is to provide a metal-inserted three-layer TCO/metal/TCO transparent electrode, which may have lower surface resistance, that is, remarkably higher electrical conductivity, compared to FTO and ITO, and a method of manufacturing the same.

The objects of the present invention are not limited to the foregoing, and other objects which are not mentioned herein will be apparently understood by those skilled in the art from the following description.

In order to accomplish the above objects, the present invention provides a method of manufacturing a flexible Ti—In—Zn—O transparent electrode for a dye-sensitized solar cell, comprising preparing a flexible transparent substrate; and simultaneously depositing Ti and IZO on the substrate or applying a single Ti—In—Zn—O target, thus forming a Ti—In—Zn—O thin-film.

In a preferred embodiment, the transparent substrate is any one selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP).

In a preferred embodiment, the transparent substrate is subjected to at least one of thermal treatment at a predetermined temperature to reduce a moisture content, and UV ozone or $O_2$ plasma pretreatment to enhance adhesion to a substrate or a Ti:Dye layer, and the forming the thin-film is performed using RF/DC magnetron type sputtering.

In a preferred embodiment, the forming the thin-film is performed under controllable process conditions of temperature, gas flow and ratio, process power, process pressure, and Dts, including:
temperature: room temperature,
gas flow (sccm): Ar—24.8, $O_2$—0.2,
process power (W): Ti—100, IZO—200,
process pressure (Pa): 0.17, and
Dts (mm): 150.

As such, sputtering process conditions for depositing the Ti—In—Zn—O transparent electrode may include a temperature ranging from room temperature to 250° C., a variety of Ar/$O_2$ gas ratio, RF and DC sputtering power, a process pressure of gas applied to the inside of a chamber, a distance between a sputtering target and a substrate, etc.

In addition, the present invention provides a flexible Ti—In—Zn—O transparent electrode for a dye-sensitized solar cell, manufactured using the above method.

In a preferred embodiment, the Ti—In—Zn—O transparent electrode has superior electrical characteristics when a Ti—In—Zn—O thin-film included therein comprises 4~34 at % of Ti, 9~17 at % of Zn, and 56~79 at % of In, except for 0 that varies with the process conditions, and, in particular, has minimum surface resistance when the Ti—In—Zn—O thin-film comprises 8 at % of Ti, 76 at % of In, and 16 at % of Zn.

In addition, the present invention provides a method of manufacturing a metal-inserted three-layer flexible transparent electrode with high conductivity for a dye-sensitized solar cell, comprising preparing a transparent substrate; simultaneously depositing Ti and IZO on the transparent substrate or applying a single Ti—In—Zn—O target, thus forming a first Ti—In—Zn—O thin-film; forming a metal thin-film on the first Ti—In—Zn—O thin-film; and simultaneously depositing Ti and IZO on the metal thin-film or applying a single Ti—In—Zn—O target, thus forming a second Ti—In—Zn—O thin-film.

In a preferred embodiment, the transparent substrate is any one selected from the group consisting of a glass substrate, polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP).

In a preferred embodiment, the metal thin-film comprises a metal selected from the group consisting of metals having high conductivity, including Ag, Cu, Al, and Au, and the forming the first Ti—In—Zn—O thin-film, the forming the second Ti—In—Zn—O thin-film, and the forming the metal thin-film are performed using RF/DC magnetron type sputtering.

In a preferred embodiment, the forming the first Ti—In—Zn—O thin-film, the forming the second Ti—In—Zn—O thin-film, and the forming the metal thin-film are performed under controllable process conditions of temperature, gas flow and ratio, process power, process pressure, and Dts, including:

<First Ti—In—Zn—O Thin-Film and Second Ti—In—Zn—O Thin-Film>
temperature: room temperature, gas flow (sccm): Ar—24.8, $O_2$—0.2, process power (W): Ti—100, IZO—200, process pressure (Pa): 0.17, and Dts (mm): 150; and
<Metal Thin-Film>
temperature: room temperature, gas flow (sccm): Ar—20, process power (W): high-conductivity metal—100, process pressure (Pa): 0.14, and Dts (mm): 150.

In a preferred embodiment, the first Ti—In—Zn—O thin-film is formed at a thickness of 10~100 nm, the second Ti—In—Zn—O thin-film is formed at a thickness of 30~80 nm and the metal thin-film is formed at a thickness of 5~25 nm.

In addition, the present invention provides a metal-inserted three-layer flexible transparent electrode with high conductivity for a dye-sensitized solar cell, manufactured using the above method.

In a preferred embodiment, the transparent electrode has a thickness of 150~300 nm.

The present invention has the following superior effects.

Specifically, the present invention can provide a transparent electrode which can be applied to a flexible substrate, thus improving resistance to external bending.

Also, the present invention can produce a transparent electrode for a dye-sensitized solar cell, which can have low surface resistance and high conductivity and transmittance despite being deposited at room temperature or low temperature, and furthermore which facilitates mass production using a sputtering process.

Also, the present invention can provide a transparent electrode for a dye-sensitized solar cell and a method of manufacturing the same, wherein the transparent electrode is improved in terms of surface characteristics with a Ti:Dye layer and an electrolyte, device stability and surface roughness.

Also, the present invention can produce a metal-inserted three-layer Ti—In—Zn—O/metal/Ti—In—Zn—O transparent electrode which has lower surface resistance, that is, remarkably higher electrical conductivity, compared to conventional FTO and ITO.

DETAILED DESCRIPTION

The terms used in the present invention are as much as possible general terms which are currently widely used, but, in specific cases, may include optional terms chosen by the applicant, the meanings of which should be interpreted in consideration of the meanings described or used in the present specification instead of by simply using the names of such terms.

Hereinafter, the technical construction of the present invention will be described in detail while referring to the accompanying drawings and preferred embodiments.

Figure 1:
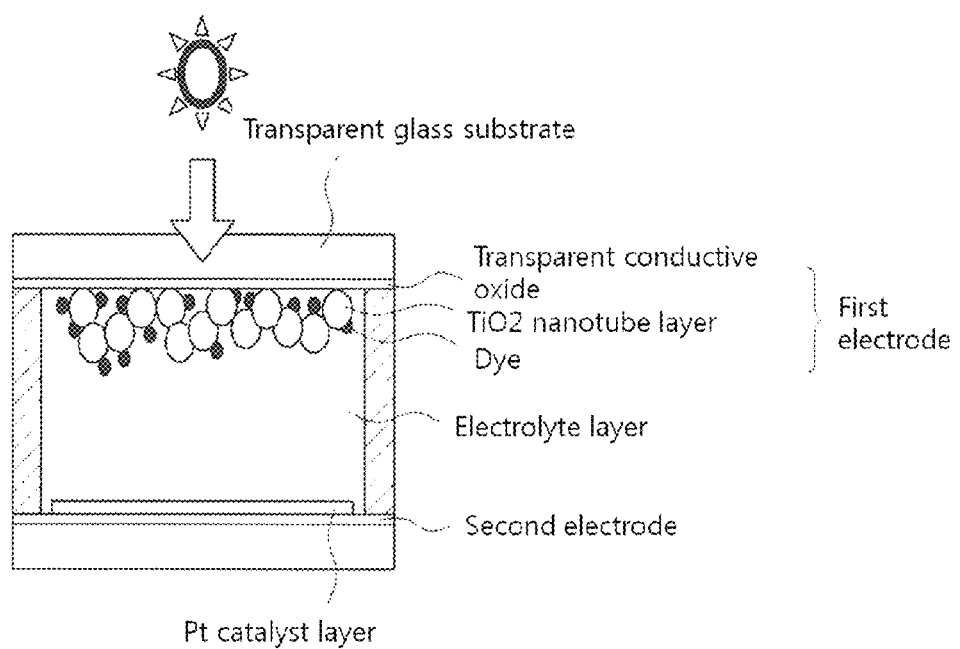
FIG. 1 is a cross-sectional view schematically illustrating a conventional dye-sensitized solar cell.
Figure 2:
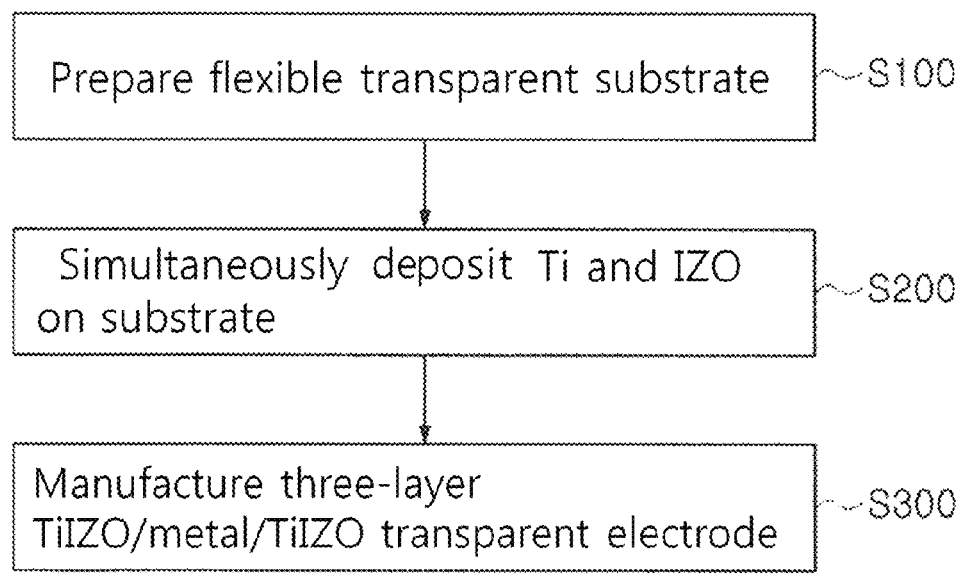
FIG. 2 is a flowchart illustrating a process of manufacturing a flexible Ti—In—Zn—O transparent electrode for a dye-sensitized solar cell and a metal-inserted three-layer transparent electrode, according to an embodiment of the present invention.

FIG. 2 illustrating a process of manufacturing a flexible Ti—In—Zn—O transparent electrode for a dye-sensitized solar cell and a metal-inserted three-layer transparent electrode, according to an embodiment of the present invention.

With reference to FIG. 2, the method of manufacturing the flexible transparent electrode for a dye-sensitized solar cell according to the embodiment of the present invention includes preparing a flexible transparent substrate (S100), simultaneously depositing Ti and IZO on the substrate thus forming a Ti—In—Zn—O thin-film (S200), and manufacturing a high-conductivity three-layer Ti—In—Zn—O/Ag or Cu/Ti—In—Zn—O transparent electrode having excellent electrical characteristics according to another embodiment of the present invention (S300).

Specifically, upon preparing the flexible transparent substrate (S100), a variety of transparent substrates having flexibility may be used, and in an embodiment of the invention, any one selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP) is useful.

In the most preferable embodiment of the invention, polyethersulfone (PES) is very useful as the transparent substrate.

In order to decrease moisture content, the flexible transparent substrate is subjected to thermal treatment at a predetermined temperature. In a preferred embodiment of the invention, thermal treatment in an oven at 60 for 30~60 min is performed to decrease moisture content.

In addition to the above thermal treatment, a variety of processes may be carried out to decrease moisture content.

Also, in order to enhance adhesion to a substrate or a Ti:Dye layer, UV ozone or $O_2$ plasma pretreatment is performed. In a preferred embodiment of the invention, pretreatment is carried out using $O_2$ plasma under conditions of $O_2$ of 50 sccm, a process pressure of 20 mTorr, a plasma power of 150 W, and a process time of 90 sec, thus enhancing adhesion.

Subsequently, both Ti and IZO are simultaneously deposited on the substrate thus forming a Ti—In—Zn—O thin-film (S200). Although the Ti—In—Zn—O thin-film may be formed using a variety of deposition processes in the present invention, both Ti and IZO are preferably deposited using RF/DC magnetron type sputtering.

Figure 3A:
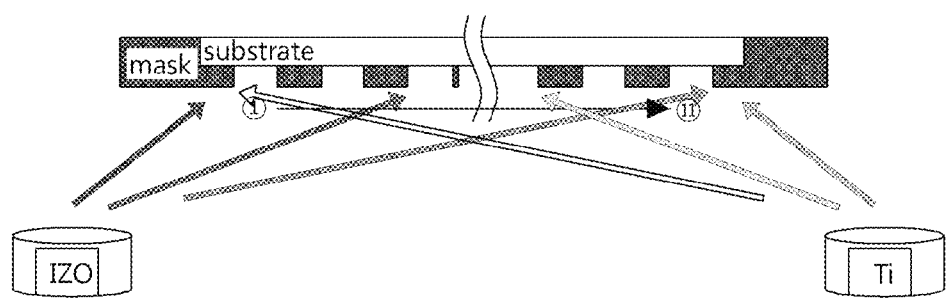
FIG. 3A is a schematic view illustrating an deposition process for forming a Ti—In—Zn—O thin-film according to an embodiment of the present invention.
Figure 3B:
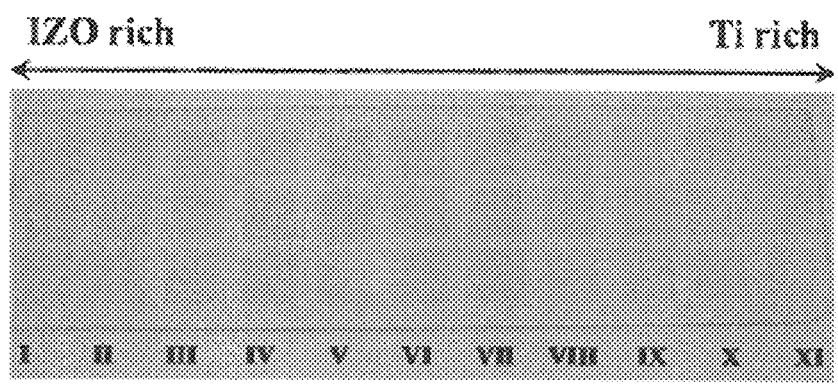
FIG. 3B is an image illustrating the Ti—In—Zn—O thin-film according to the embodiment of the present invention.

With reference to FIG. 3 which schematically illustrates an deposition process for forming the Ti—In—Zn—O thin-film according to the embodiment of the present invention, IZO acting as a first target is spaced apart from the transparent substrate by a predetermined distance, and Ti acting as a second target is spaced apart from the transparent substrate by a predetermined distance so as to face the first target.

As such, IZO may be formed at various composition ratios, but preferably includes 90 wt % of $In_2O_3$ and 10 wt % of ZnO.

Also, a plurality of masks is formed at a predetermined interval on the transparent substrate so that the transparent substrate is not completely exposed.

In a preferred embodiment of the invention, the masks are positioned so that a total of 11 places of the transparent substrate are exposed.

Subsequently, both Ti and IZO are deposited simultaneously using RF/DC magnetron type combinatorial sputtering, so that Ti—In—Zn—O thin-films having different Ti and IZO compositions are formed on ①~⑪ it which are the exposed portions of the transparent substrate.

That is, eleven Ti—In—Zn—O thin-films having compositions in which the amount of Ti increases and the amount of In decreases from ① toward ⑪ are formed.

The compositions of the eleven Ti—In—Zn—O thin-films according to the embodiment of the present invention are shown in Table 1 below.

In regard thereto, the Ti—In—Zn—O thin-film according to the present invention preferably comprises 4~34 at % of Ti, 9~17 at % of Zn, and 56~79 at % of In. As the amount of Ti increases, the amount of Zn is not greatly changed but the amount of comparatively expensive In is remarkably decreased, making it possible to profitably manufacture a transparent electrode for a dye-sensitized solar cell.

TABLE 1

| Element (at %) | #1 | #2 | #3 | #4 | #5 | #6 | #7 | #8 | #9 | #10 | #11 |
|---|---|---|---|---|---|---|---|---|---|---|---|
| Ti/(In + Zn + Ti) | 4 | 6 | 8 | 9 | 12 | 15 | 19 | 24 | 27 | 31 | 34 |
| In/(In + Zn + Ti) | 79 | 78 | 76 | 75 | 72 | 71 | 68 | 67 | 61 | 57 | 56 |
| Zn/(In + Zn + Ti) | 17 | 16 | 16 | 16 | 15 | 14 | 13 | 9 | 11 | 12 | 9 |

On the other hand, forming the thin-film (S200) according to the embodiment of the present invention may be carried out under various process conditions, but is preferably performed at room temperature or low temperature without increasing the temperature and at high vacuum (low $10^{-6}$ Pa), thus obtaining a thin-film. Actually, the Ti—In—Zn—O composition which exhibits the minimum surface resistance includes 8 at % of Ti, 76 at % of In and 16 at % of Zn, except for 0 that varies with the process conditions [FIG. 5].

Also, the conditions required to form a thin-film according to a preferred embodiment of the present invention are summarized in Table 2 below.

TABLE 2

| | Temp. | Gas Flow (sccm) | | Process Power (W) | | Process Pressure (Pa) | Dts (mm) | Thin-film thickness (nm) |
|---|---|---|---|---|---|---|---|---|
| | | Ar | O$_2$ | Ti | IZO | | | |
| Ti—In—Zn—O | Room Temp. | 24.8 | 0.2 | 100 | 200 | 0.17 | 150 | 150~300 |

In Table 2, Dts indicates the perpendicular distance between the transparent substrate and the first and second targets.

The thickness of the Ti—In—Zn—O thin-film is set in the range of 150~300 nm so as to exhibit superior surface resistance and transmittance adapted for a transparent electrode for a dye-sensitized solar cell.

If the thickness of the transparent electrode is 100 nm or less, surface resistance is considerably increased to 100Ω/□ or more, and upon applying it to a flexible dye-sensitized solar cell, problems of sealing with a Ti:Dye layer and permeation of moisture to a flexible substrate may be undesirably caused. Hence, a thin-film of 100 nm or less cannot be used. In particular, if the thickness of the Ti—In—Zn—O thin-film is 50 nm or less, transmittance is high to the level of 90% or more, but surface resistance becomes remarkably increased to 500Ω/□ or more, and thus this thin-film may be used for a compressive touch panel but cannot be applied to a high-efficiency dye-sensitized solar cell.

Below is a description of a method of manufacturing a metal-inserted three-layer flexible transparent electrode for a dye-sensitized solar cell using the Ti—In—Zn—O thin-film, according to another embodiment of the present invention.

Specifically, the method of manufacturing a high-conductivity three-layer Ti—In—Zn—O/Ag or Cu/Ti—In—Zn—O transparent electrode having excellent electrical characteristics according to another embodiment of the present invention includes preparing a transparent substrate, simultaneously depositing Ti and IZO on the transparent substrate thus forming a first Ti—In—Zn—O thin-film, forming a metal thin-film of Au or Cu on the first Ti—In—Zn—O thin-film, and simultaneously depositing Ti and IZO on the metal film thus forming a second Ti—In—Zn—O thin-film.

Examples of the transparent substrate may include a variety of transparent substrates, and preferably useful is any one selected from the group consisting of a glass substrate, polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP).

Also, the transparent substrate may be further subjected to at least one of thermal treatment to decrease moisture content, and UV ozone or plasma pretreatment to enhance adhesion to a substrate or a Ti:Dye layer, as mentioned in the embodiment of the present invention.

Forming the first and second Ti—In—Zn—O thin-films is the same as mentioned in the embodiment of the present invention. However, in the case of a metal-inserted transparent electrode having high conductivity, the total thickness of the Ag or Cu metal-inserted three-layer transparent electrode including the first and second Ti—In—Zn—O thin-films and the inserted metal is optimally set in the range of 150~300 nm so that it is appropriate for use in a transparent electrode for a solar cell.

As mentioned above, if the thickness of the transparent electrode is 100 nm or less, surface resistance is remarkably increased to 100Ω/□ or more. When this electrode is applied to a flexible dye-sensitized solar cell, sealing with a Ti:Dye layer and permeation of moisture to a flexible substrate may occur. Hence, a thin-film of 100 nm or less cannot be used.

On the other hand, forming the metal thin-film according to another embodiment of the present invention may be performed variously, and is preferably conducted using RF/DC magnetron type combinatorial sputtering.

As such, the metal thin-film may be formed using any metal such as Al, Au and so on, and is preferably formed of Ag or Cu. In particular, the metal thin-film of Ag or Cu is inserted between oxide films to thus increase inherent ductility of metal, so that resistance of the transparent electrode to bending may be increased upon bending of a substrate under external stress.

The process conditions for forming the thin-films are summarized in Table 3 below.

TABLE 3

| | Temp. | Gas Flow (sccm) | | Process Power (W) | | Process Pressure (Pa) | Dts (mm) | Thin-film thickness (nm) |
|---|---|---|---|---|---|---|---|---|
| | | Ar | O$_2$ | Ti | IZO | | | |
| First Ti—In—Zn—O thin-film | Room Temp. | 24.8 | 0.2 | 100 | 200 | 0.17 | 150 | 10~100 |
| Ag thin-film | Room Temp. | 20 | | Ag 100 | | 0.14 | 150 | 5~25 |
| Second Ti—In—Zn—O thin-film | Room Temp. | 24.8 | 0.2 | 100 | 200 | 0.17 | 150 | 30~80 |

In Table 3, Dts is defined as above.

The total thickness of the thin-films of the three-layer transparent electrode should be adjusted in the range of 300 nm or less which is an allowable thickness value of a typical transparent electrode for a solar cell. In a preferred embodiment of the invention, the first Ti—In—Zn—O thin-film was formed at a thickness of 10~100 nm, the second Ti—In—Zn—O thin-film was formed at a thickness of 30~80 nm and the metal thin-film was formed at a thickness of 5~25 nm. The total thickness of the three-layer transparent electrode having high conductivity is preferably 150~300 nm.

With reference to the appended drawings, the effects of the present invention are specified below.

Figure 4:
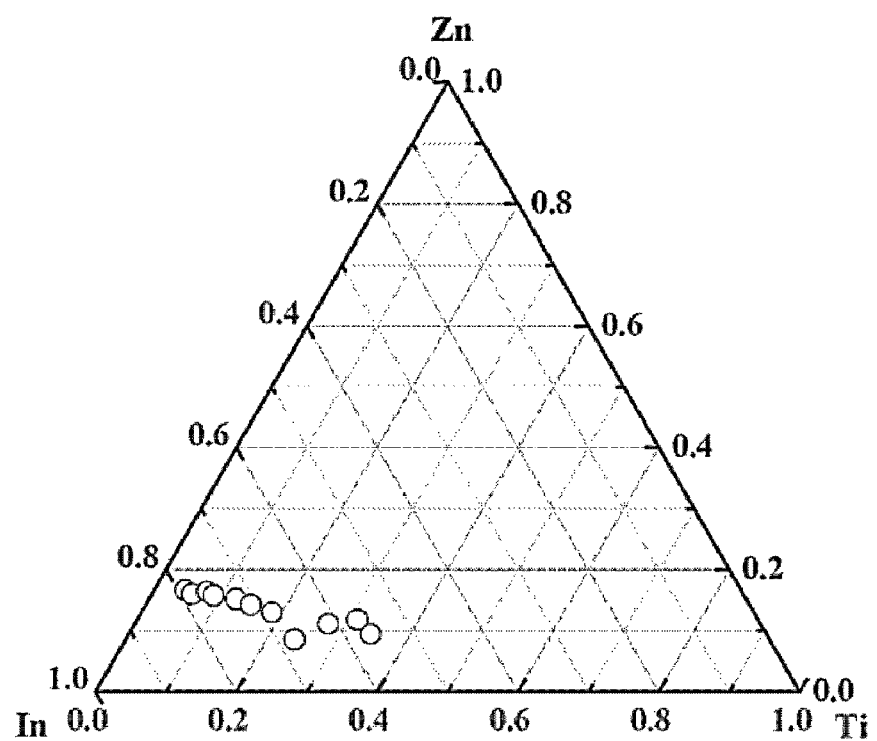
FIG. 4 is a diagram illustrating the composition range of Ti, In and Zn elements of the Ti—In—Zn—O thin-film according to the embodiment of the present invention.

FIG. 4 is a diagram illustrating the composition range of Ti, In and Zn elements of the Ti—In—Zn—O thin-film according to the embodiment of the present invention. As illustrated in FIG. 4, as the amount of Ti increases toward a Ti direction, the amount of In may decrease, but there is no great change in the amount of Zn, compared to a change in the amount of In. This means that, in the Ti—In—Zn—O thin-film, the amount of the expensive rare-earth element In may decrease in proportion to an increase in the amount of Ti, making it possible to profitably manufacture a transparent electrode for a dye-sensitized solar cell, compared to ITO.

Figure 5:
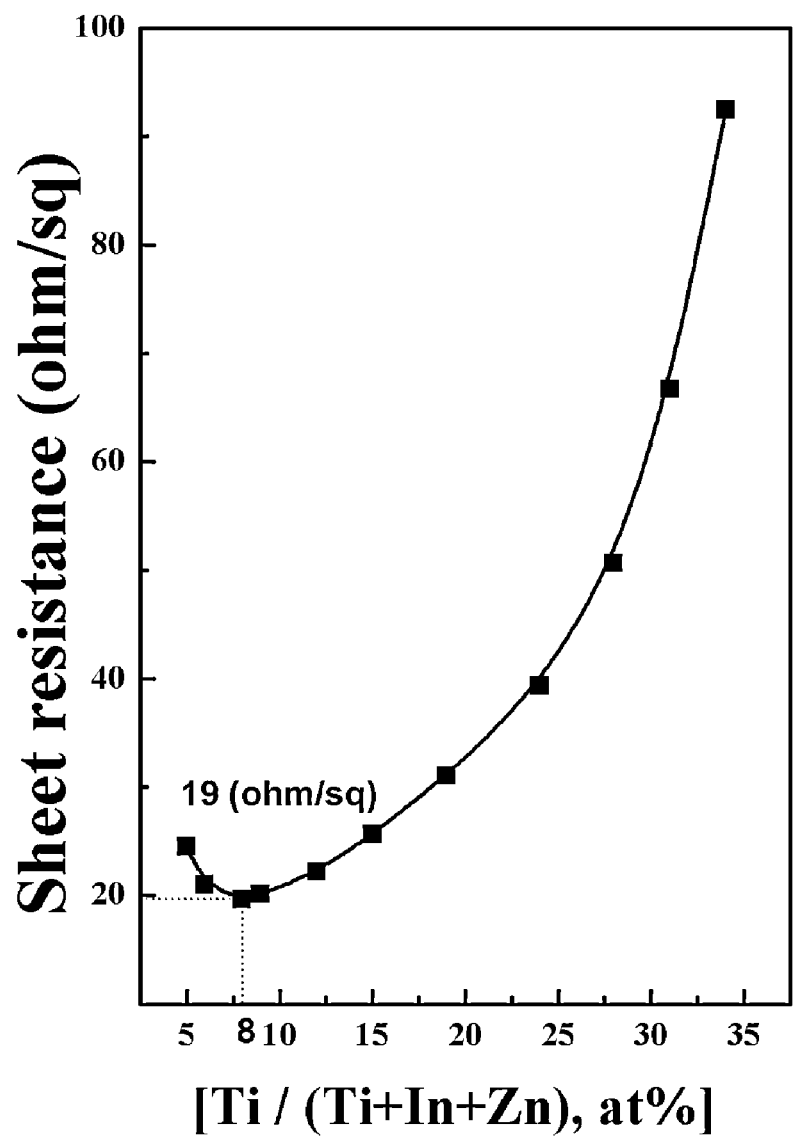
FIG. 5 is a graph illustrating changes in surface resistance of the Ti—In—Zn—O thin-film according to the embodiment of the present invention depending on the amount of Ti.

FIG. 5 is a graph illustrating changes in surface resistance of the Ti—In—Zn—O thin-film according to the embodiment of the present invention depending on the amount of Ti.

As illustrated in FIG. 5, as the amount of Ti increases, the amount of expensive In may decrease but resistance may increase. In the drawing, surface resistance is seen to be the lowest (19 ohm/sq) at about 8 at % of Ti, and thus the Ti—In—Zn—O thin-film according to the present invention is preferably formed on the transparent substrate using 8 at % of Ti. As experimental results, when Ti—In—Zn—O includes 8 at % of Ti, 76 at % of In, and 16 at % of Zn, except for 0 that varies with the process conditions, a flexible transparent electrode for a dye-sensitized solar cell having minimum surface resistance may be manufactured.

Figure 6A:
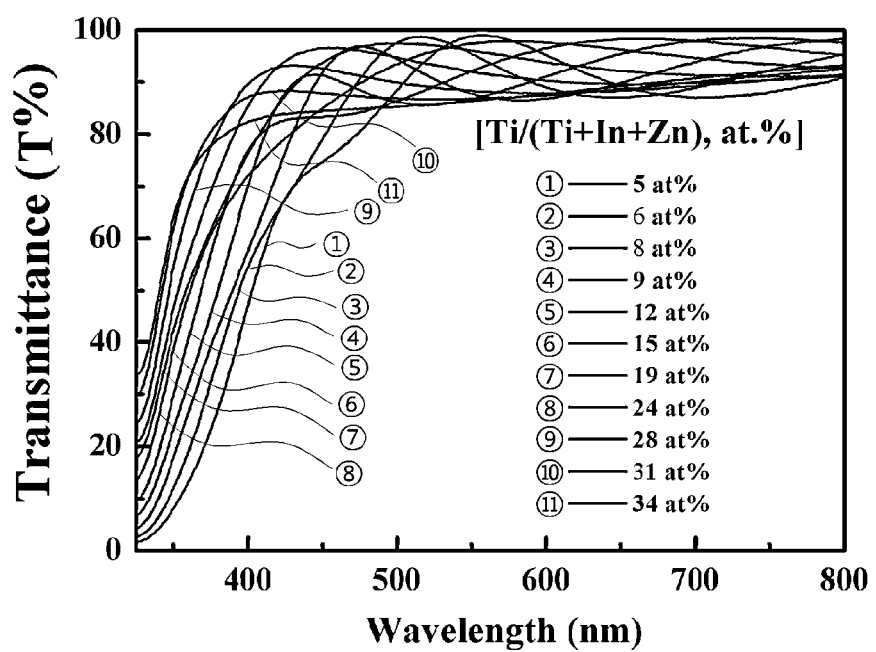
FIG. 6A is a graph illustrating optical characteristics of the Ti—In—Zn—O thin-film according to the embodiment of the present invention in the visible light range.
Figure 6B:
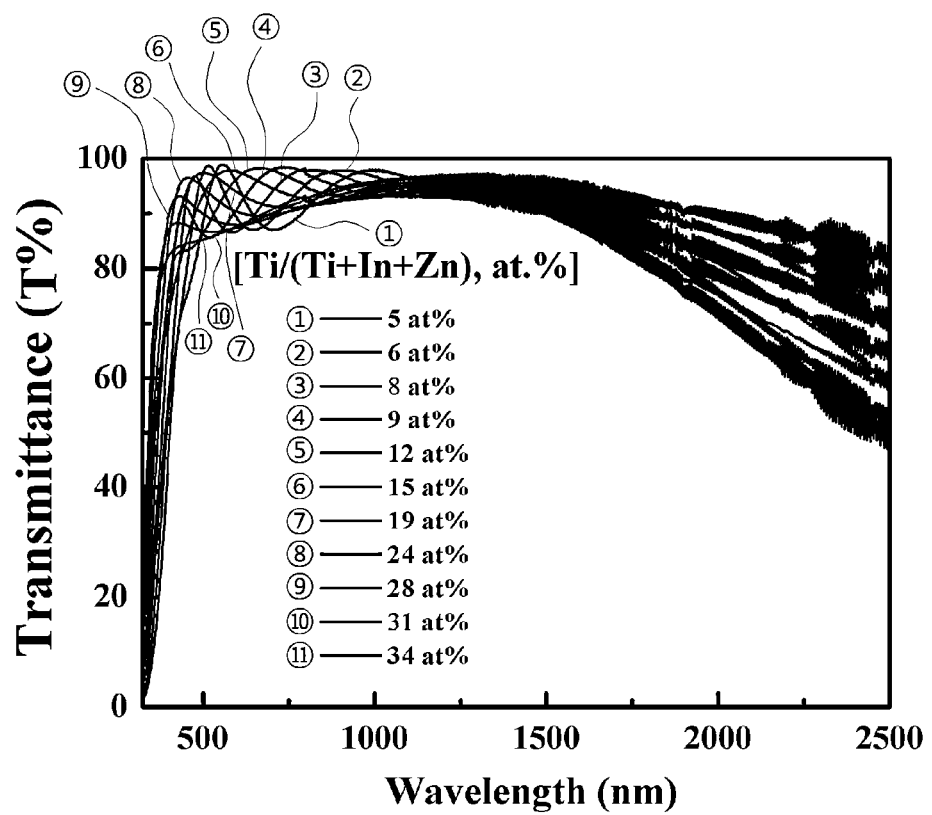
FIG. 6B is a graph illustrating optical characteristics of the Ti—In—Zn—O thin-film according to the embodiment of the present invention in the UV-Vis-IR range.

FIG. 6A is a graph illustrating optical characteristics of the Ti—In—Zn—O thin-film according to the embodiment of the present invention in the visible light range, and FIG. 6B is a graph illustrating optical characteristics of the Ti—In—Zn—O thin-film according to the embodiment of the present invention in the UV-Vis-IR range.

A typical solar cell requires high transmittance when solar light is incident thereon.

In the case of the Ti—In—Zn—O thin-film according to the embodiment of the present invention, as seen in FIGS. 6A and 5B, a high transmittance of 80% or more is shown in the visible light and near IR range, and a very high transmittance of 95% or more may be obtained in a specific wavelength range.

Figure 7:
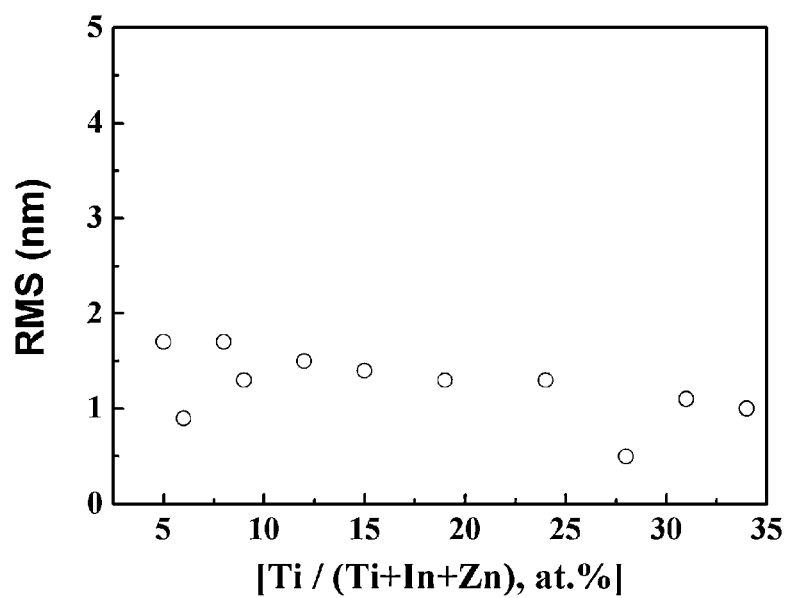
FIG. 7 is a graph illustrating surface roughness $R_{RMS}$ of the Ti—In—Zn—O thin-film according to the embodiment of the present invention depending on the amount of Ti, as analyzed using AFM.

FIG. 7 is a graph illustrating the surface roughness R$_{RMS}$ of the Ti—In—Zn—O thin-film according to the embodiment of the present invention depending on the amount of Ti.

As illustrated in FIG. 7, the Ti—In—Zn—O thin-film according to the present invention exhibits a low surface roughness of 2 nm (RMS) or less regardless of the amount of Ti, which means that the surface of the thin-film is evaluated to be very flat.

Figure 8:
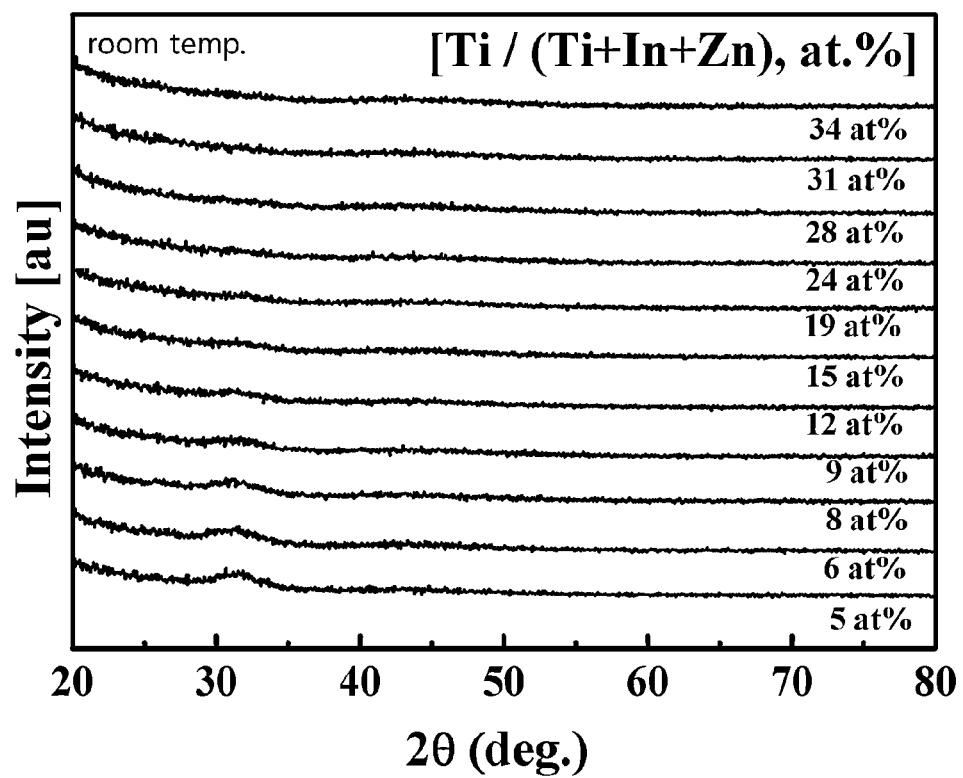
FIG. 8 is a graph illustrating XRD of the Ti—In—Zn—O thin-film according to the embodiment of the present invention depending on the amount of Ti.

FIG. 8 is a graph illustrating XRD of the Ti—In—Zn—O thin-film according to the embodiment of the present invention depending on the amount of Ti.

As illustrated in FIG. 8, the Ti—In—Zn—O thin-film according to the present invention exhibits thin-film characteristics having an amorphous structure in all samples regardless of the composition ratio thereof.

In the case where a thin-film has a crystalline structure, resistance to external bending may be low, undesirably causing defects such as cracking and dislocation in the thin-film. However, because the Ti—In—Zn—O thin-film according to the embodiment of the present invention has an amorphous structure, it may have improved resistance to bending compared to a brittle crystalline ceramic thin-film and may prevent defects such as cracking and dislocation in the thin-film from occurring.

Figure 9A:
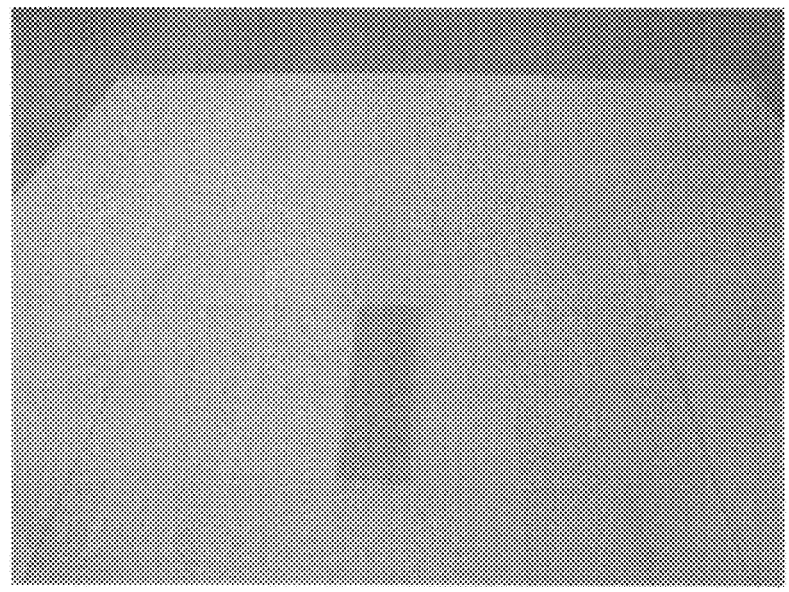
FIG. 9A is an image illustrating the tape test results for adhesion between the Ti—In—Zn—O thin-film according to the embodiment of the present invention and a flexible PES substrate.

FIG. 9A is an image illustrating the tape test results for adhesion between the Ti—In—Zn—O thin-film according to the embodiment of the present invention and a flexible PES substrate.

Figure 9B:
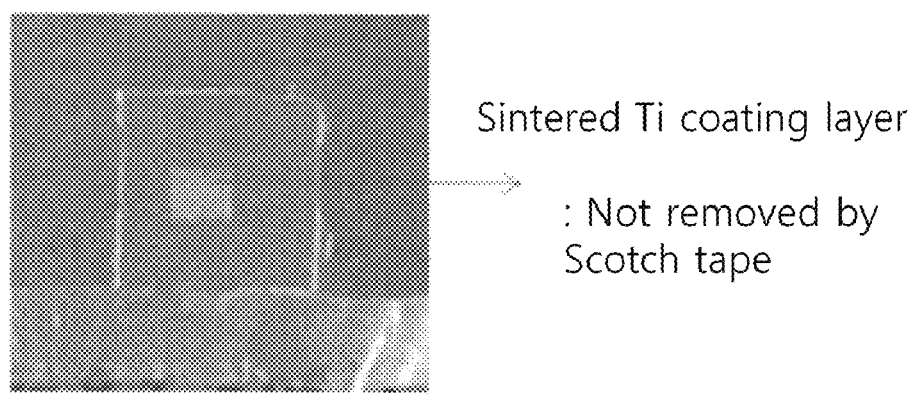
FIG. 9B is an image illustrating the tape test results for adhesion between the Ti—In—Zn—O thin-film according to the embodiment of the present invention and a Ti:Dye layer.

FIG. 9B is an image illustrating the tape test results for adhesion between the Ti—In—Zn—O thin-film according to the embodiment of the present invention and a Ti:Dye layer.

As illustrated in FIGS. 9A and 9B, the Ti—In—Zn—O thin-film deposited on the PES substrate was not removed by Scotch tape, and also, the Ti:Dye paste applied on the Ti—In—Zn—O thin-film was not removed by Scotch tape. This means that the Ti—In—Zn—O thin-film has higher adhesion to the PES substrate and the Ti nanocrystal/dye layer, compared to the Scope tape.

Figure 10A:
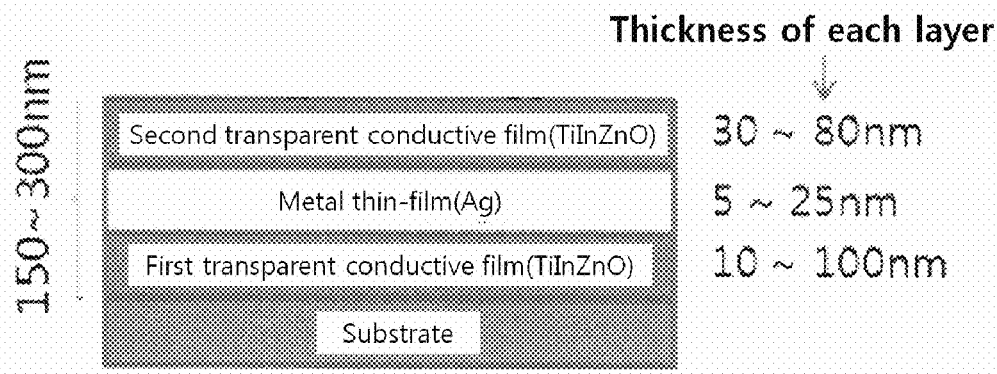
FIG. 10A is a schematic view illustrating a three-layer Ti—In—Zn—O/metal (Ag)/Ti—In—Zn—O transparent electrode according to another embodiment of the present invention.

FIG. 10A schematically illustrates a three-layer Ti—In—Zn—O (10~100 nm thick)/Ag (5~25 nm thick)/Ti—In—Zn—O (30~80 nm thick) transparent electrode on a glass substrate, according to another embodiment of the present invention.

Figure 10B:
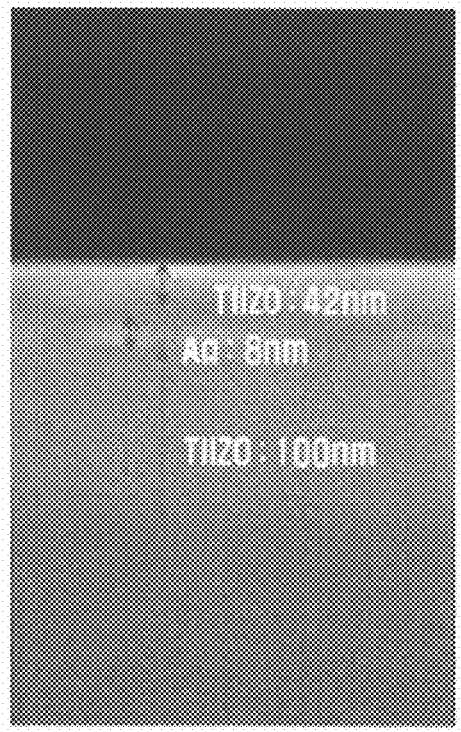
FIG. 10B is an actual electron microscopic image illustrating the three-layer Ti—In—Zn—O/metal (Ag)/Ti—In—Zn—O transparent electrode according to another embodiment of the present invention.

FIG. 10B is an actual electron microscopic image illustrating a three-layer Ti—In—Zn—O/metal (Ag)/Ti—In—Zn—O transparent electrode having a total thickness of 150 nm according to a preferred embodiment of the present invention.

Figure 11:
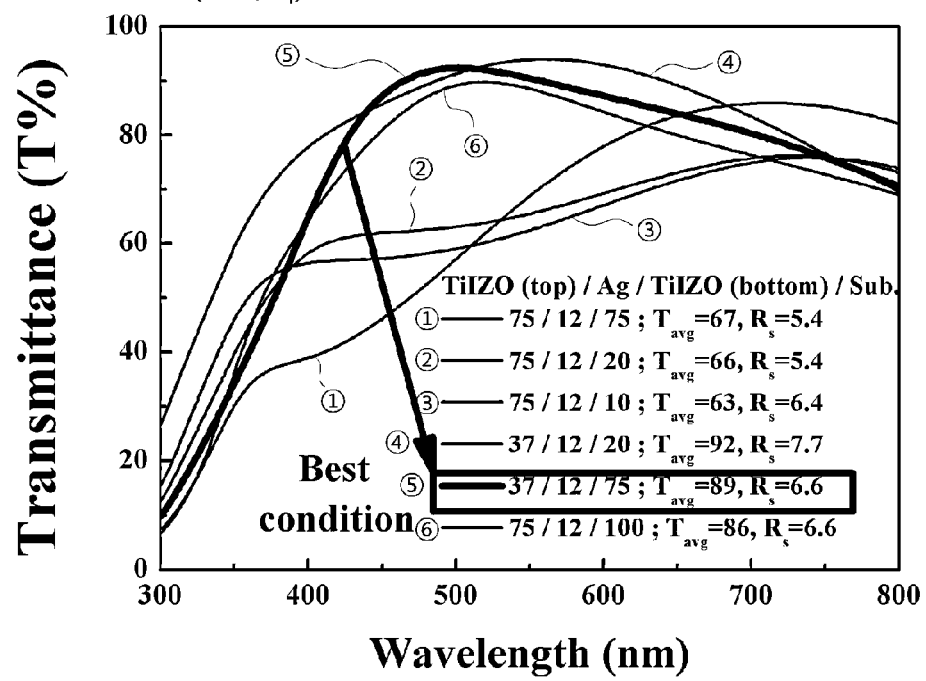
FIG. 11 is a graph illustrating surface resistance, transmittance and a preferred example of the three-layer Ti—In—Zn—O/metal (Ag)/Ti—In—Zn—O transparent electrode according to another embodiment of the present invention depending on the thickness of each layer.

FIG. 11 is a graph illustrating surface resistance, transmittance and a preferred example of the three-layer Ti—In—Zn—O/metal (Ag)/Ti—In—Zn—O thin-films according to another embodiment of the present invention depending on the thicknesses of each layer.

As illustrated in FIG. 11, the three-layer Ti—In—Zn—O (100 nm)/Ag (8 nm)/Ti—In—Zn—O (42 nm) thin-films according to the preferred embodiment of the present invention may exhibit a low surface resistance of 6.63 ohm/sq and a high transmittance of about 90% at maximum.

Figure 12:
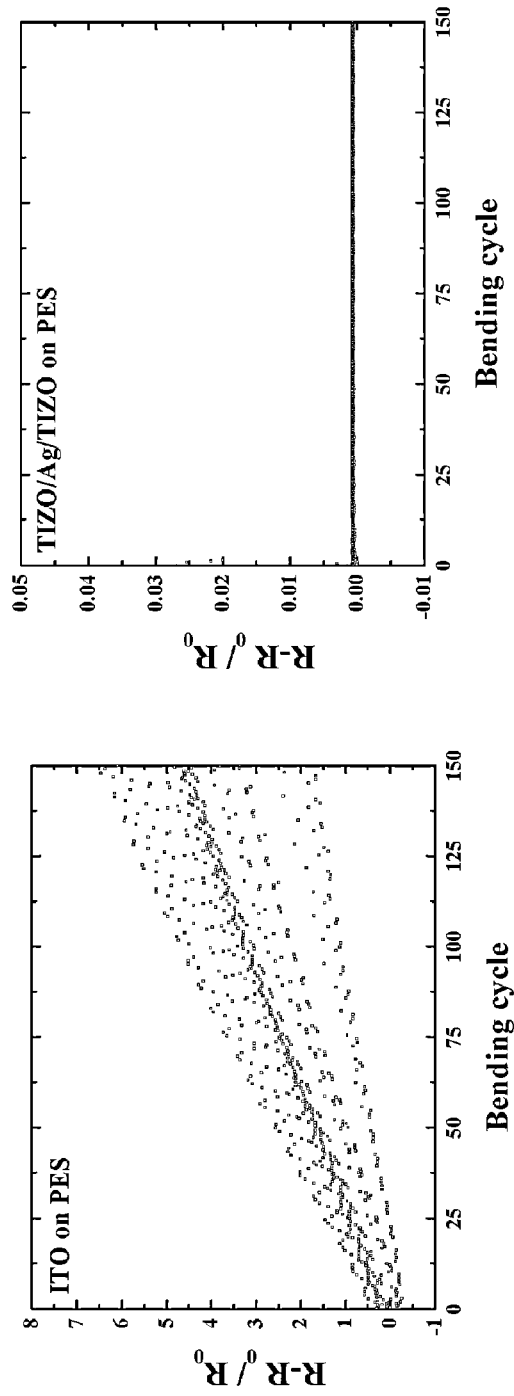
FIG. 12 is a graph illustrating changes in initial resistance to external bending of an ITO transparent electrode and the three-layer Ti—In—Zn—O/metal (Ag)/Ti—In—Zn—O transparent electrode according to another embodiment of the present invention.

FIG. 12 is a graph illustrating changes in initial resistance to external bending of the three-layer Ti—In—Zn—O/metal (Ag)/Ti—In—Zn—O transparent electrode according to another embodiment of the present invention.

As illustrated in FIG. 12, as results of evaluation using a resistance tester for external bending, the ITO thin-film deposited on the flexible PES substrate had surface resistance which was about six times increased after 150 bending cycles, compared to initial resistance, making it difficult to apply to a flexible dye-sensitized solar cell. However, in the case of the Ti—In—Zn—O thin-film according to the present invention, resistance becomes uniform under the same external bending test conditions (sample size: 30×10 mm, straight-line distance between both ends of sample: 25 mm, bending speed: 20 mm/sec, bending distance: 5 mm), whereby this thin-film may exhibit very superior mechanical resistance to external bending compared to the conventional ITO thin-film, and is thus regarded as very appropriate for use in a flexible transparent electrode for a dye-sensitized solar cell.

Consequently, the flexible transparent electrode for a dye-sensitized solar cell according to the embodiments of the invention is configured such that the Ti—In—Zn—O thin-film which is amorphous is fundamentally provided and the metal thin-film such as Ag is inserted thereto thus increasing flexibility of a substrate. Therefore, when this transparent electrode is applied to a flexible substrate, resistance to external bending may be greatly improved, and furthermore, this transparent electrode may have high conductivity and transmittance despite being deposited at room temperature or low temperature and may be produced at comparatively low cost.

Moreover, because the transparent electrode for a dye-sensitized solar cell according to the present invention contains Ti, it has superior surface characteristics with a Ti:Dye layer and an electrolyte, adhesion thereto, and surface roughness, compared to a conventional FTO transparent electrode, and this transparent electrode may be effectively manufactured.

Also, this transparent electrode is superior because its surface resistance is 8 Ω/sq or less, compared to surface resistance (15~25 Ω/sq) of conventional ITO and FTO, and is thus suitable for use in manufacturing a high-efficiency dye-sensitized solar cell.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

The invention claimed is:

1. A method of manufacturing a flexible Ti—In—Zn—O transparent electrode for a dye-sensitized solar cell, comprising:
    preparing a flexible transparent substrate; and
    simultaneously depositing Ti and IZO on the substrate, thus forming a Ti—In—Zn—O thin-film;
    wherein the forming the thin-film by simultaneously depositing Ti and IZO on the substrate is performed under controllable process conditions of temperature, gas flow and ratio, process power, process pressure, and a distance between a sputtering target and a substrate (Dts), including:
    temperature: room temperature,
    gas flow (sccm): Ar—24.8, O2—0.2,
    process power (W): Ti—100, IZO—200,
    process pressure (Pa): 0.17,
    Dts (mm): 150.

2. The method of claim 1, wherein the transparent substrate is any one selected from the group consisting of polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP).

3. The method of claim 2, wherein the transparent substrate is subjected to at least one of thermal treatment at a predetermined temperature to reduce a moisture content, and a UV ozone or O2 plasma pretreatment to enhance adhesion to a substrate or a Ti:Dye layer.

4. The method of claim 1, wherein the forming the thin-film is performed using both RF and DC magnetron sputtering.

5. A method of manufacturing a flexible Ti—In—Zn—O transparent electrode for a dye-sensitized solar cell, the method comprising:
    preparing a flexible transparent substrate; and
    simultaneously depositing Ti and IZO on the substrate or applying a single Ti—In—Zn—O target, thus forming a Ti—In—Zn—O thin-film, wherein the Ti—In—Zn—O thin-film comprises 4 to 34 at % of Ti, 9 to 17 at % of Zn, and 56 to 79 at % of In, and O varies with the process conditions.

6. The method of claim 5, wherein the Ti—In—Zn—O thin-film comprises 8 at % of Ti, 76 at % of In, and 16 at % of Zn, and O varies with the process conditions.

7. A method of manufacturing a metal-inserted three-layer flexible transparent electrode with conductivity for a dye-sensitized solar cell, comprising:
    preparing a transparent substrate;
    simultaneously depositing Ti and IZO on the transparent substrate, thus forming a first Ti—In—Zn—O thin-film;
    forming a metal thin-film on the first Ti—In—Zn—O thin-film; and
    simultaneously depositing Ti and IZO on the metal thin-film, thus forming a second Ti—In—Zn—O thin-film,
    wherein the forming the first Ti—In—Zn—O thin-film and the forming the second Ti—In—Zn—O thin-film are performed under controllable process conditions of temperature, gas flow and ratio, process power, process pressure, and a distance between a sputtering target and a substrate (Dts), including:
    temperature: room temperature,
    gas flow (sccm): Ar—24.8, O2—0.2,
    process power (W): Ti—100, IZO—200,
    process pressure (Pa): 0.17, and
    Dts (mm): 150; and the forming the metal thin-film is performed under controllable process conditions of temperature, gas flow and ratio, process power, process pressure, and a distance between a sputtering target and a substrate (Dts), including:
temperature: room temperature,
gas flow (sccm): Ar—20,
process power (W): metal—100,
process pressure (Pa): 0.14, and
Dts (mm): 150.

8. The method of claim 7, wherein the transparent substrate is any one selected from the group consisting of a glass substrate, polyethersulfone (PES), polyacrylate (PAR), polyetherimide (PEI), polyethylene naphthalate (PEN), polyethylene terephthalate (PET), polyphenylene sulfide (PPS), polyallylate, polyamide (PI), polyimide, polycarbonate (PC), cellulose triacetate (TAC), and cellulose acetate propionate (CAP).

9. The method of claim 7, wherein the metal thin-film comprises a metal selected from the group consisting of Ag, Cu, Al, and Au.

10. The method of claim 7, wherein the forming the first Ti—In—Zn—O thin-film, the forming the second Ti—In—Zn—O thin-film, and the forming the metal thin-film are performed using both RF/DC magnetron sputtering.

11. The method of claim 7, wherein the first Ti—In—Zn—O thin-film is formed at a thickness of 10 to 100 nm, the second Ti—In—Zn—O thin-film is formed at a thickness of 30 to 80 nm and the metal thin-film is formed at a thickness of 5 to 25 nm.

* * * * *